(12) United States Patent
Toriumi et al.

(10) Patent No.: US 8,063,452 B2
(45) Date of Patent: Nov. 22, 2011

(54) SEMICONDUCTOR DEVICE AND METHOD FOR MANUFACTURING THE SAME

(75) Inventors: Akira Toriumi, Kanagawa (JP); Koji Kita, Tokyo (JP); Kazuyuki Tomida, Leuven (BE); Yoshiki Yamamoto, Hyogo (JP)

(73) Assignee: The University of Tokyo, Tokyo (JP)

( * ) Notice: Subject to any disclaimer, the term of this patent is extended or adjusted under 35 U.S.C. 154(b) by 588 days.

(21) Appl. No.: 11/574,483

(22) PCT Filed: Aug. 30, 2005

(86) PCT No.: PCT/JP2005/015702
§ 371 (c)(1),
(2), (4) Date: Jun. 17, 2009

(87) PCT Pub. No.: WO2006/025350
PCT Pub. Date: Mar. 9, 2006

(65) Prior Publication Data
US 2010/0019357 A1    Jan. 28, 2010

(30) Foreign Application Priority Data

Aug. 30, 2004 (JP) .................... 2004-250393

(51) Int. Cl.
| | |
|---|---|
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |
| H01L 23/58 | (2006.01) |
| H01L 21/336 | (2006.01) |
| H01L 21/3205 | (2006.01) |
| H01L 21/4763 | (2006.01) |
| H01L 21/31 | (2006.01) |
| H01L 21/469 | (2006.01) |

(52) U.S. Cl. ............... 257/411; 257/635; 257/E21.266; 257/E29.165; 438/287; 438/591; 438/463

(58) Field of Classification Search ................. 438/287, 438/763, 591; 257/411, 635, E21.266, E29.165
See application file for complete search history.

(56) References Cited

U.S. PATENT DOCUMENTS

| | | | |
|---|---|---|---|
| 2002/0113261 A1 | 8/2002 | Iwasaki | |
| 2004/0053472 A1* | 3/2004 | Kiryu et al. | 438/287 |

FOREIGN PATENT DOCUMENTS

| | | | |
|---|---|---|---|
| JP | 2004011741 A | | 1/2004 |
| JP | 2004079606 A | | 3/2004 |
| JP | 2004-111741 | * | 8/2004 |

OTHER PUBLICATIONS

Wilk, G.D., et al., "High-k gate dielectrics: Current status and materials properties considerations," Journal of Applied Physics 89(10):5243-5275, May 15, 2001.

* cited by examiner

Primary Examiner — David S Blum
(74) Attorney, Agent, or Firm — Christensen O'Connor Johnson Kindness PLLC

(57) ABSTRACT

A gate insulating film having a high dielectric constant, a semiconductor device provided with the gate insulating film, and a method for manufacturing such film and device are provided. The semiconductor device is provided with a group 14 (IVA) semiconductor board and a first oxide layer. The first oxide layer is composed of $MO_2$ existing on the board, where M is a first metal species selected from the group 4 (IVB); and $M'_xO_y$, where M' is a second metal species selected from the group 3 (IIIB) and a group composed of lanthanide series, and x and y are integers decided by the oxidation number of M.

33 Claims, 6 Drawing Sheets (a) C-V characteristics (b) J-V characteristics

Resistance-Temperature Curve of Hetero Junction (V=-3V)

SEMICONDUCTOR DEVICE AND METHOD FOR MANUFACTURING THE SAME

CROSS-REFERENCE TO RELATED APPLICATION

This application is a 371 of PCT/JP05/15702 filed Aug. 30, 2005 and claims priority under 35 USC §119 to Japanese Patent Application No. 2004-250393 filed on Aug. 30, 2004, the contents of which are herein incorporated by reference in their entirety for all purposes.

FIELD OF THE INVENTION

The present invention relates to a semiconductor device and a manufacturing method thereof. The present invention relates to, in particular, a semiconductor device comprising a gate insulating film having a high dielectric constant, and a manufacturing method thereof.

BACKGROUND OF THE INVENTION

In order to realize a high-speed and highly-integrated semiconductor device, demanded is a gate insulating film having a higher dielectric constant than that of $SiO_2$ without leakage current problem. Candidate materials of such a gate insulating film are required to have some characteristics, such as not only a high dielectric constant, but also reactivity with Si, a level of band gap and the like. For example, $HfO_2$ and $HfSiO_x$ are exemplified as materials that satisfy the above characteristics. Researches on such materials have recently been proceeding (see, for example, Patent Document 1, Non-patent Document 1).

Patent Document 1: Japanese Patent Application Laid-Open (JP-A) No. 2004-79606.

Non-patent Document 1: J. Appl. Phys. 89, pp. 5243-5275 (2001).

DISCLOSURE OF THE INVENTION

Problems to be Solved by the Invention

However, demanded is a next- or next-next-generation gate insulating film having a higher dielectric constant than that of $HfO_2$ and $HfSiO_x$ and satisfying the above characteristics for higher speed operation and/or higher integration in the semiconductor device.

Accordingly, an object of the present invention is to provide a gate insulating film having a high dielectric constant, a semiconductor device comprising the gate insulating film, and a manufacturing method thereof.

Means for Solving the Problems

The inventors of the present invention have found the following facts, as a result of intensive study for the accomplishment of the above object: Oxide comprised of $MO_2$ and oxide $M'_xO_y$ of a group 3 (IIIB) or lanthanide series has such a high dielectric constant that is inconceivable from the dielectric constant of each of the oxide materials, wherein M means a first metal species selected from a group 4 (IVB), for example Hf; M' means a second metal species selected from the group consisting of a group 3 (IIIB) and lanthanide series; and each of x and y is an integer depending on an oxidation number of M'. In addition, the inventors have found that the oxide satisfies the characteristics required for a gate insulating film. The following inventions are found based on the above findings:

<1> A semiconductor device comprising:
a group 14 (IVA) semiconductor substrate; and
a first oxide layer located on the substrate, wherein the first oxide layer comprised of $MO_2$ (where M is a first metal selected from a group 4 (IVB)) and $M'_xO_y$ (where M' is a second metal species selected from the group consisting of a group 3 (IIIB) and lanthanide series, and each of x and y is an integer depending on an oxidation number of M'), and the first oxide layer has a high dielectric constant.

<2> In the above item <1>, the device may further comprise a second oxide layer between the group 14 (IVA) semiconductor substrate and the first oxide layer, wherein the second oxide layer may comprise an oxide comprised of an element included in the group 14 (IVA) semiconductor substrate and the second metal species.

<3> In the above item <2>, the device may comprise a layered structure consisting of three layers of the substrate, the second oxide layer and the first oxide layer.

<4> In any one of the above items <1> to <3>, an amount of the second metal species M' contained in the first oxide layer may be more than 0 at % and not more than 50 at %, preferably more than 0 at % and not more than 25 at %, when a total of the second metal species and the first metal species is set to 100 at %.

<5> In any one of the above items <1> to <4>, the second metal species may have such a concentration gradient in the first oxide layer that a concentration of the second metal species is high on the substrate side and gets lower at a farther point from the substrate.

<6> In anyone of the above items <1> to <5>, the second metal species may be selected from the group consisting of Sc, Y, La, Ce and Lu.

<7> In any one of the above items <1> to <5>, the second metal species may be selected from the group consisting of Sc, Y, La and Lu.

<8> In any one of the above items <1> to <7>, the first metal species may be Hf; the second metal species may be Y; the first oxide layer may consist essentially of $HfO_2$—$Y_2O_3$; and an amount of Y may be more than 0 at % and not more than 50 at %, preferably more than 0 at % and not more than 25 at %, when a total of Y and Hf is set to 100 at %.

<9> In any one of the above items <1> to <8>, the group 14 (IVA) semiconductor substrate may be a substrate selected from the group consisting of Si, Ge, SiGe, SiC, GaN and C (diamond), preferably a Si substrate or a Ge substrate.

<10> In any one of the above items <2> to <9>, the group 14 (IVA) semiconductor substrate may be a Si substrate, the second oxide layer may consist essentially of an oxide comprising Y and Si, and the first oxide layer may consist essentially of $HfO_2$—$Y_2O_3$.

<11> In the above item <10>, an amount of Y in $HfO_2$—$Y_2O_3$ of the first oxide layer may be more than 0 at % and not more than 50 at %, preferably more than 0 at % and not more than 25 at %, when a total of Y and Hf is set to 100 at %.

<12> In any one of the above items <2> to <11>, the group 14 (IVA) semiconductor substrate may be a Ge substrate, the second oxide layer may consist essentially of an oxide comprising Y and Ge, and the first oxide layer may consist essentially of $HfO_2$—$Y_2O_3$.

<13> In the above item <12>, an amount of Y in $HfO_2$—$Y_2O_3$ of the first oxide layer may be more than 0 at % and not more than 50 at %, preferably more than 0 at % and not more than 25 at %, when a total of Y and Hf is set to 100 at %.

<14> In any one of the above items <1> to <7>, the first metal species may be Hf, the second metal species may be La, the first oxide layer may consist essentially of $HfO_2$—$La_2O_3$, and an amount of La may be more than 0 at % and not more than 60 at %, when a total of La and Hf is set to 100 at %, and preferably the semiconductor device may have a relative dielectric constant of 20 or greater and an amount of La may range from 40 to 60 at %, when a total of La and Hf is set to 100 at %.

<15> In any one of the above items <1> to <7> and <14>, the group 14 (IVA) semiconductor substrate may be a substrate selected from the group consisting of Si, Ge, SiGe, SiC, GaN and C (diamond).

<16> In any one of the above items <2> to <7>, <14> and <15>, the group 14 (IVA) semiconductor substrate may be a Si substrate, the second oxide layer may consist essentially of an oxide comprising La and Si, and the first oxide layer may consist essentially of $HfO_2$—$La_2O_3$.

<17> In the above item <16>, an amount of La in $HfO_2$—$La_2O_3$ of the first oxide layer may be more than 0 at % and not more than 60 at %, when a total of La and Hf is set to 100 at %, and preferably the semiconductor device may have a relative dielectric constant of 20 or greater and an amount of La may range from 40 to 60 at %, when a total of La and Hf is set to 100 at %.

<18> In any one of the above items <2> to <7>, <14> and <15>, the group 14 (IVA) semiconductor substrate may be a Ge substrate, the second oxide layer may consist essentially of an oxide comprising La and Ge, and the first oxide layer may consist essentially of $HfO_2$—$La_2O_3$.

<19> In the above item <18>, an amount of La in $HfO_2$—$La_2O_3$ of the first oxide layer may be more than 0 at % and not more than 60 at %, when a total of La and Hf is set to 100 at %, and preferably the semiconductor device may have a relative dielectric constant of 20 or greater and an amount of La may range from 40 to 60 at %, when a total of La and Hf is set to 100 at %.

<20> In any one of the above items <1> to <7>, the first metal species may be Hf, the second metal species may be Ce, the first oxide layer may consist essentially of $HfO_2$—$CeO_2$, and an amount of Ce may be more than 0 at % and not more than 50 at %, preferably may range from 20 to 50 at %, when a total of Ce and Hf is set to 100 at %.

<21> In any one of the above items <1> to <7> and <20>, the group 14 (IVA) semiconductor substrate may be a substrate selected from the group consisting of Si, Ge, SiGe, SiC, GaN, and C (diamond).

<22> In any one of the above items <1> to <7>, <20> and <21>, the group 14 (IVA) semiconductor substrate may be a Si substrate, the second oxide layer may consist essentially of an oxide comprising Ce and Si, and the first oxide layer may consist essentially of $HfO_2$—$CeO_2$.

<23> In the above item <22>, an amount of Ce in $HfO_2$—$CeO_2$ of the first oxide layer may be more than 0 at % and not more than 50 at %, preferably may range from 20 to 50 at %, when a total of Ce and Hf is set to 100 at %.

<24> In any one of the above items <1> to <7>, <20> and <21>, the group 14 (IVA) semiconductor substrate may be a Ge substrate, the second oxide layer may consist essentially of an oxide comprising Ce and Ge, and the first oxide layer may consist essentially of $HfO_2$—$CeO_2$.

<25> In the above item <24>, an amount of Ce in $HfO_2$—$CeO_2$ of the first oxide layer may be more than 0 at % and not more than 50 at %, preferably may range from 20 to 50 at %, when a total of Ce and Hf is set to 100 at %.

<26> A method of manufacturing a semiconductor device, comprising:

a deposition layer forming step of depositing M' doped $MO_2$ (M is a first metal species selected from a group 4 (IVB)) on a group 14 (IVA) semiconductor substrate, to form a deposition layer, wherein M' is a second metal species selected from the group consisting of a group 3 (IIIB) and lanthanide series; and a first oxide layer forming step of conducting heat treatment for the deposition layer, to form an $MO_2$-$M'_xO_y$ layer, wherein each of x and y is an integer depending on an oxidation number of M'.

<27> In the above item <26>, the method may further comprise a second oxide layer forming step prior to the deposition layer forming step, wherein the second oxide layer forming step may comprise a step of depositing an oxide $M'_aO_b$ (each of a and b is an integer depending on the second species M') of the second metal species M' selected from the group consisting of a group 3 (IIIB) and lanthanide series on the group 14 (IVA) semiconductor substrate; and thereafter a step of conducting heat treatment for the deposition, to form a second oxide layer comprising an second oxide comprising the second metal species and an element contained in the group 14 (IVA) semiconductor substrate.

<28> In the above item <26> or <27>, the heat treatment in the first oxide layer forming step may be conducted between 600° C. and 1000° C., preferably between 600° C. and 800° C. In particular, the step may be conducted under an inert gas having an oxygen partial pressure of 1% or lower, or in a vacuum atmosphere.

<29> In the above item <27> or <28>, the heat treatment in the second oxide layer forming step may be conducted in a vacuum atmosphere not more than $10^{-4}$ Pa and between 600° C. and 1000° C., preferably between 600° C. and 800° C.

<30> In any one of the above items <27> to <29>, the semiconductor device may comprise a layered structure consisting of three layers of the substrate, the second oxide layer and the first oxide layer.

<31> In any one of the above items <26> to <30>, the deposition layer forming step may comprises a step of doping the second metal species M' in a manner that an amount of the second metal species M' contained in the first oxide layer is more than 0 at % and not more than 50 at %, when a total of the second metal species and the first metal species is set to 100 at %.

<32> In any one of the above items <26> to <31>, the first oxide layer may be formed in a manner that the second metal species in the first oxide layer has such a concentration gradient that a concentration of the second metal species is high on the substrate side and gets lower at a farther point from the substrate, by the heat treatment in the first oxide layer forming step.

<33> In any one of the above items <26> to <32>, the second metal species may be selected from the group consisting of Sc, Y, La, Ce and Lu.

<34> In any one of the above items <26> to <32>, the second metal species may be selected from the group consisting of Sc, Y, La and Lu.

<35> In any one of the above items <26> to <34>, the first metal species may be Hf; the second metal species may be Y; the first oxide layer may consist essentially of $HfO_2$—$Y_2O_3$; and an amount of Y may be more than 0 at % and not more than 50 at %, preferably more than 0 at % and not more than 25 at %, when a total of Y and Hf is set to 100 at %.

<36> In any one of the above items <26> to <35>, the group 14 (IVA) semiconductor substrate may be a substrate selected from the group consisting of Si, Ge, SiGe, SiC, GaN and C (diamond).

<37> In any one of the above items <27> to <36>, the group 14 (IVA) semiconductor substrate may be a Si substrate; the second oxide layer may consist essentially of an oxide comprising Y and Si; and the first oxide layer may consist essentially of $HfO_2$—$Y_2O_3$.

<38> In the above item <37>, an amount of Y in $HfO_2$—$Y_2O_3$ of the first oxide layer may be more than 0 at % and not more than 50 at %, preferably more than 0 at % and not more than 25 at %, when a total of Y and Hf is set to 100 at %.

<39> In any one of the above items <27> to <36>, the group 14 (IVA) semiconductor substrate may be a Ge substrate; the second oxide layer may consist essentially of an oxide comprising Y and Ge; and the first oxide layer may consist essentially of $HfO_2$—$Y_2O_3$.

<40> In the above item <39>, an amount of Y in $HfO_2$—$Y_2O_3$ of the first oxide layer may be more than 0 at % and not more than 50 at %, preferably more than 0 at % and not more than 25 at %, when a total of Y and Hf is set to 100 at %.

<41> In any one of the above items <26> to <34>, the first metal species may be Hf; the second metal species may be La; the first oxide layer may consist essentially of $HfO_2$—$La_2O_3$; and an amount of La may be more than 0 at % and not more than 60 at % when a total of La and Hf is set to 100 at %, and preferably the semiconductor device may have a relative dielectric constant of 20 or greater and an amount of La may range from 40 to 60 at %, when a total of La and Hf is set to 100 at %.

<42> In any one of the above items <26> to <34> and <41>, the group 14 (IVA) semiconductor substrate may be a substrate selected from the group consisting of Si, Ge, SiGe, SiC, GaN and C (diamond).

<43> In any one of the above items <27> to <34>, <41> and <42>, the group 14 (IVA) semiconductor substrate may be a Si substrate; the second oxide layer may consist essentially of an oxide comprising La and Si; and the first oxide layer may consist essentially of $HfO_2$—$La_2O_3$.

<44> In the above item <43>, an amount of La in $HfO_2$—$La_2O_3$ of the first oxide layer may be more than 0 at % and not more than 60 at %, when a total of La and Hf is set to 100 at %, and preferably the semiconductor device may have a relative dielectric constant of 20 or greater and an amount of La may range from 40 to 60 at %, when a total of La and Hf is set to 100 at %.

<45> In any one of the above items <27> to <34>, <41> and <42>, the group 14 (IVA) semiconductor substrate may be a Ge substrate; the second oxide layer may consist essentially of an oxide comprising La and Ge; and the first oxide layer may consist essentially of $HfO_2$—$La_2O_3$.

<46> In the above item <45>, an amount of La in $HfO_2$—$La_2O_3$ of the first oxide layer may be more than 0 at % and not more than 60 at %, when a total of La and Hf is set to 100 at %, and preferably the semiconductor device may have a relative dielectric constant of 20 or greater and an amount of La may range from 40 to 60 at %, when a total of La and Hf is set to 100 at %.

<47> In any one of the above items <26> to <34>, the first metal species may be Hf; the second metal species may be Ce; the first oxide layer may consist essentially of $HfO_2$—$CeO_2$, and an amount of Ce may be more than 0 at % and not more than 50 at %, preferably may range from 20 to 50 at %, when a total of Ce and Hf is set to 100 at %.

<48> In any one of the above items <26> to <34> and <47>, the group 14 (IVA) semiconductor substrate may be a substrate selected from the group consisting of Si, Ge, SiGe, SiC, GaN and C (diamond).

<49> In any one of the above items <26> to <34>, <47> and <48>, the group 14 (IVA) semiconductor substrate may be a Si substrate; the second oxide layer may consist essentially of an oxide comprising Ce and Si; and the first oxide layer may consist essentially of $HfO_2$—$CeO_2$.

<50> In the above item <49>, an amount of Ce in $HfO_2$—$CeO_2$ of the first oxide layer is more than 0 at % and not more than 50 at %, preferably may range from 20 to 50 at %, when a total of Ce and Hf is set to 100 at %.

<51> In any one of the above items <26> to <34>, <47> and <48>, the group 14 (IVA) semiconductor substrate may be a Ge substrate; the second oxide layer may consist essentially of an oxide comprising Ce and Ge; and the first oxide layer may consist essentially of $HfO_2$—$CeO_2$.

<52> In the above item <51>, an amount of Ce in $HfO_2$—$CeO_2$ of the first oxide layer may be more than 0 at % and not more than 50 at %, preferably may range from 20 to 50 at %, when a total of Ce and Hf is set to 100 at %.

<53> A semiconductor device comprising:
a group 14 (IVA) semiconductor substrate; and
a first oxide layer located on the substrate, wherein the first oxide layer is comprised of $MO_2$ (M is a first metal species selected from a group 4 (IVB)) and $M''O_2$ (M" is a third metal species which is Si or Ge), and the first oxide layer has a high dielectric constant.

<54> In the above item <53>, the device may further comprise a second oxide layer between the group 14 (IVA) semiconductor substrate and the first oxide layer, wherein the second oxide layer may comprise an oxide comprising an element contained in the group 14 (IVA) semiconductor substrate and the third metal species.

<55> In the above item <54>, the device may comprise a layered structure consisting of three layers of the substrate, the second oxide layer and the first oxide layer.

<56> In any one of the above items <53> to <55>, an amount of the third metal species M" contained in the first oxide layer may be more than 0 at % and not more than 50 at %, when a total of the third metal species and the first metal species is set to 100 at %.

<57> In any one of the above items <53> to <56>, the third metal species may have such a concentration gradient in the first oxide layer that a concentration thereof is high on the substrate side and gets lower at a farther point from the substrate.

<58> In any one of the above items <53> to <57>, the first metal species may be Hf; the third metal species may be Si; the first oxide layer may consist essentially of $HfO_2$—$SiO_2$; and an amount of Si may be more than 0 at % and not more than 30 at %, preferably more than 3 at % and not more than 15 at %, when a total of Si and Hf is set to 100 at %.

<59> In any one of the above items <53> to <57>, the first metal species may be Hf; the third metal species may be Si; the first oxide layer may consist essentially of $HfO_2$—$SiO_2$; the semiconductor device has a relative dielectric constant of 20 or greater; and an amount of the third metal species M" contained in the first oxide layer may be more than 0 at % and not more than 30 at %, when a total of the third metal species and the first metal species is set to 100 at %, and preferably the semiconductor device has a relative dielectric constant of 25 or greater; and an amount of the third metal species M" contained in the first oxide layer may be more than 3 at % and not more than 15 at %, when a total of said third metal species and said first metal species is set to 100 at %.

<60> In any one of the above items <53> to <59>, the group 14 (IVA) semiconductor substrate may be a substrate selected from the group consisting of Si, Ge, SiGe, SiC, GaN and C (diamond).

<61> A method of manufacturing a semiconductor device, comprising:
a deposition layer forming step of depositing M" (M" is a third metal species which is Si or Ge) doped $MO_2$ (M is a first metal species selected from a group 4 (IVB)) on the group 14 (IVA) semiconductor substrate, to form a deposition layer; and a first oxide layer forming step of conducting heat treatment for the deposition layer, to form an $MO_2$-$M''O_2$ layer.

<62> In the above item <61>, the method may further comprise a second oxide layer forming step prior to the deposition layer forming step, wherein the second oxide layer forming step may comprise a step of depositing an oxide $M''O_2$ of the third metal species M'' which is Si or Ge on the group 14 (IVA) semiconductor substrate, and thereafter a step of conducting heat treatment for the deposit, to form a second oxide layer comprising a second oxide comprising the third metal species and an element contained in the group 14 (IVA) semiconductor substrate.

<63> In the above item <61> or <62>, the heat treatment in the first oxide layer forming step may be conducted between 600° C. and 1000° C.

<64> In the above item <62> or <63>, the heat treatment in the second oxide layer forming step may be conducted in a vacuum atmosphere at not more than $10^{-4}$ Pa and between 600° C. and 1000° C.

<65> In any one of the above items <62> to <64>, the semiconductor device may comprise a layered structure consisting essentially of three layers of the substrate, the second oxide layer and the first oxide layer.

<66> In any one of the above items <61> to <65>, the third metal species M'' may be doped in the deposition layer forming step in such a manner that an amount of the third metal species M'' contained in the first oxide layer is more than 0 at % and not more than 50 at %, when a total of the third metal species and the first metal species is set to 100 at %.

<67> In any one of the above items <61> to <66>, the first oxide layer may be formed in a manner that the third metal species in the first oxide layer has a concentration gradient such that a concentration of the third metal species in the first oxide layer is high on the substrate side and gets lower at a farther point from the substrate, by the heat treatment in the first oxide layer forming step.

<68> In any one of the above items <61> to <67>, the first metal species may be Hf; the third metal species may be Si; the first oxide layer may consist essentially of $HfO_2$—$SiO_2$; and an amount of Si may be more than 0 at % and not more than 30 at %, preferably more than 3 at % and not more than 15 at %, when a total of Si and Hf is set to 100 at %.

<69> In any one of the above items <61> to <67>, the first metal species may be Hf; the third metal species may be Si; the first oxide layer may consist essentially of $HfO_2$—$SiO_2$; the semiconductor device may have a relative dielectric constant of 20 or greater; and an amount of the third metal species Si contained in the first oxide layer may be more than 0 at % and not more than 30 at %, when a total of Si and the first metal species is set to 100 at %, and preferably the semiconductor device may have a relative dielectric constant of 25 or greater; and an amount of the third metal species Si contained in the first oxide layer may be more than 3 at % and not more than 15 at %, when a total of Si and said first metal species is set to 100 at %.

<70> In any one of the above items <61> to <69>, the group 14 (IVA) semiconductor substrate may be a substrate selected from the group consisting of Si, Ge, SiGe, SiC, GaN and C (diamond).

<71> A semiconductor device comprising:
a group 14 (IVA) semiconductor substrate; and
a first oxide layer located on the substrate, wherein the first oxide layer is comprised of $MO_2$ (M is a first metal species selected from a group 4 (IVB)) and $TiO_2$, and the first oxide layer has a high dielectric constant.

<72> In the above item <71>, the device may further comprise a second oxide layer between the group 14 (IVA) semiconductor substrate and the first oxide layer, wherein the second oxide layer may comprise an oxide comprising an element contained in the group 14 (IVA) semiconductor substrate and a metal species Ti.

<73> In the above item <72>, the device may comprise a layered structure consisting essentially of three layers of the substrate, the second oxide layer and the first oxide layer.

<74> In any one of the above items <71> to <73>, an amount of the metal species Ti contained in the first oxide layer may be between 20 to 70 at %, preferably between 40 to 60 at %, when a total of the metal species Ti and the first metal species is set to 100 at %.

<75> In any one of the above items <71> to <73>, the first metal species may be Hf; the first oxide layer may consist essentially of $HfO_2$—$TiO_2$; the semiconductor device may have a relative dielectric constant of 20 or greater; and an amount of the metal species Ti contained in the first oxide layer may be between 20 and 70 at %, when a total of said metal species Ti and said first metal species is set to 100 at %, and preferably the semiconductor device may have a relative dielectric constant of 25 or greater; and an amount of the metal species Ti contained in the first oxide layer may be between 40 and 60 at %, when a total of said metal species Ti and said first metal species is set to 100 at %.

<76> In any one of the above items <71> to <75>, the metal species Ti may have such a concentration gradient in the first oxide layer that a concentration thereof is high on the substrate side and gets lower at a farther point from the substrate.

<77> In any one of the above items <71> to <76>, the group 14 (IVA) semiconductor substrate may be a substrate selected from the group consisting of Si, Ge, SiGe, SiC, GaN and C (diamond).

<78> A method of manufacturing a semiconductor device, comprising:
a deposition layer forming step of depositing metal species Ti doped $MO_2$ (M is a first metal species selected from a group 4 (IVB)) on a group 14 (IVA) semiconductor substrate, to form a deposition layer; and
a first oxide layer forming step of conducting heat treatment for the deposition layer, to form an $MO_2$—$TiO_2$ layer.

<79> In the above item <78>, the method may further comprise a second oxide layer forming step prior to the deposition layer forming step, wherein the second oxide layer forming step may comprise a step of depositing $TiO_2$, an oxide of a metal species Ti, on a group 14 (IVA) semiconductor substrate, and thereafter a step of conducting heat treatment for the deposit, to form a second oxide layer comprising a second oxide comprising the metal species Ti and an element contained in the group 14 (IVA) semiconductor substrate.

<80> In the above item <78> or <79>, the heat treatment in the first oxide layer forming step may be conducted between 600° C. and 1000° C.

<81> In the above item <79> or <80>, the heat treatment in the second oxide layer forming step may be conducted in a vacuum atmosphere at not more than $10^{-4}$ Pa and between 600° C. and 1000° C.

<82> In any one of the above items <79> to <81>, the semiconductor device may comprise a layered structure consisting essentially of three layers of the substrate, the second oxide layer and the first oxide layer.

<83> In any one of the above items <78> to <82>, the metal species Ti may be doped in the deposition layer forming step in such a manner that an amount of the metal species Ti contained in the first oxide layer may be between 20 and 70 at %, preferably between 40 and 60 at %, when a total of the metal species Ti and the first metal species is set to 100 at %.

<84> In any one of the above items <78> to <83>, the first oxide layer may be formed in a manner that the metal species Ti in the first oxide layer has a concentration gradient such that a concentration of Ti in the first oxide layer is high on the substrate side and gets lower at a farther point from the substrate, by the heat treatment in the first oxide layer forming step.

<85> In any one of the above items <78> to <84>, the group 14 (IVA) semiconductor substrate may be a substrate selected from the group consisting of Si, Ge, SiGe, SiC, GaN and C (diamond).

Effects of the Invention

The present invention can provide a gate insulating film having a high dielectric constant, a semiconductor device comprising the gate insulating film, and a manufacturing method thereof.

PREFERRED EMBODIMENTS CARRYING OUT THE INVENTION

The present invention will be described in detail hereinafter.

The present invention provides a semiconductor device comprising: a group 14 (IVA) semiconductor substrate; and a first oxide layer located on the substrate, wherein the first oxide layer comprises $MO_2$ (M is a first metal species selected from a group 4 (IVB)) and $M'_xO_y$ (M' is a second metal species selected from the group consisting of a group 3 (IIIB) and lanthanide series, and x and y are integers depending on an oxidation number of M'), and the first oxide layer has a high dielectric constant.

Further, the present invention provides a semiconductor device comprising: a group 14 (IVA) semiconductor substrate; and a first oxide layer located on the substrate, wherein the first oxide layer comprises $MO_2$ (M is a first metal species selected from a group 4 (IVB)) and $M''O_2$ (M'' is a third metal species which is Si or Ge), and the first oxide layer has a high dielectric constant.

More, the present invention provides a semiconductor device comprising: a group 14 (IVA) semiconductor substrate; and a first oxide layer located on the substrate, wherein the first oxide layer comprises $MO_2$ (M is a first metal species selected from a group 4 (IVB)) and $TiO_2$, and the first oxide layer has a high dielectric constant.

Furthermore, the number "14" used herein preceding parentheses in the term "group 14 (IVA)" represents a group number based on a long-form periodic table. In addition, the number "IVA" within parentheses represents a group number based on a short-form periodic table.

The substrate used in the device according to the present invention is comprised of a group 14 (IVA) semiconductor. Specifically, the examples of the substrate may include a Si substrate, a Ge substrate, a SiGe substrate, a SiC substrate, a GaN substrate, a C (diamond) substrate and the like. Strictly speaking, the GaN substrate is not a group 14 (IVA) semiconductor, but can still be treated as a group 14 (IVA) semiconductor herein. Of these substrates, the Si substrate is preferable in that it is a conventionally used substrate. The Ge substrate is preferable in that a low voltage operation and high mobilities can be expected as compared with Si.

In the device according to the present invention, the first oxide layer is formed on the group 14 (IVA) semiconductor substrate. A second oxide layer, as will be described later, is preferably formed between the group 14 (IVA) semiconductor substrate and the first oxide layer. In some cases, upon manufacturing the device according to the present invention, an oxide of a group 14 (IVA) metal in the group 14 (IVA) semiconductor substrate may be formed between the group 14 (IVA) semiconductor substrate and the first oxide layer. However, it is preferable that the device does not include the oxide of group 14 (IVA).

The first oxide layer consists essentially of $MO_2$ and $M'_xO_y$, or consists essentially of $MO_2$ and $M''O_2$, or consists essentially of $MO_2$ and $TiO_2$ (in this case, M excludes Ti). Note that the phrase "consist essentially of" is intended to allow inclusion of a very small amount of other atoms, as long as the inclusion has no detrimental effect on the characteristics of the first oxide layer, though it is still ideally "consist of". Inclusion of a very small amount of other atoms may be inclusion of Zr when Hf is used as M, inclusion of Hf when Zr is used as M, or diffusion of other atoms from an adjacent layer.

M in $MO_2$ is a first metal species selected from a group 4 (IVB). M may be Ti, Zr or Hf. Preferably, M may be Zr or Hf, and more preferably Hf.

M' in $M'_xO_y$ is a second metal species selected from the group consisting of a group 3 (IIIB) and lanthanide series, and x and y are integers depending on an oxidation number of M'. The second metal species may preferably be selected from the group consisting of Sc, Y, La, Ce and Lu. M'' in $M''O_2$ is a third metal species which is Si or Ge. As described above, if the first oxide layer comprises $MO_2$ and $TiO_2$ or consists essentially of these materials, the first metal species M excludes Ti.

The first oxide, which forms the first oxide layer, may be expressed as '$MO_2$-$M'_xO_y$', '$MO_2$-$M''O_2$' or '$MO_2$—$TiO_2$' used herein. This expression indicates mixed oxide, but does not indicate a mixture of different kinds of oxide.

The first oxide has a remarkably high dielectric constant which differs from that of $MO_2$ alone and also differs from that of $M'_xO_y$, $M''O_2$ or $TiO_2$ alone. Though not based on a complete theory, the reason for such a high dielectric constant is because the first oxide consisting of $MO_2$ and $M'_xO_y$ or the first oxide consisting of $MO_2$ and $M''O_2$, and the like has a given unit cell with specifically high polarizability and with a small unit cell volume. Since the first oxide has a high dielectric constant, it can be used as a gate insulating film.

The phrase "high dielectric constant" used herein may preferably be a relative dielectric constant of 20 or greater, and more preferably 25 or greater.

In the first oxide layer, an amount of $MO_2$ and $M'_xO_y$ or an amount of $MO_2$ and $M''O_2$ may be set so as to effectively result in a specific crystallization structure producing the above-descried high dielectric constant. Specifically, if Hf is used as the first metal species, and Y or the like is used as the second metal species M', an amount of Y is more than 0 at % and not more than 50 at %, and preferably more than 0 at % and not more than 25 at %, when a total of Y and Hf is set to 100 at %. If Hf is used as the first metal species and La or the like is used as the second metal species M', an amount of La or the like is more than 0 at % and not more than 60 at %, preferably between 40 and 60 at %, when a total of La and Hf is set to 100 at %. It is preferred that an amount of La be in the range of 40 to 60 at % in a combination of Hf and La, because its crystallization temperature increases. Further, if Hf is used as the first metal species and Ce or the like is used as the second metal species M', an amount of Ce or the like is more than 0 at % and not more than 50 at %, preferably in the range of 20 to 50 at %, when a total of Ce and Hf is set to 100 at %.

An amount of the third metal species M" contained in the first oxide layer may be more than 0 at % and not more than 50 at %, when a total of the third metal species M" and the first metal species M is set to 100 at %. Specifically, if Hf is used as the first metal species and Si is used as the third metal species, an amount of this Si is more than 0 at % and not more than 30 at %, and more preferably more than 3 at % and not more than 15 at %, when a total of Si and Hf is set to 100 at %. If the amount of Si is more than 0 at % and not more than 30 at %, the semiconductor device can have a relative dielectric constant of 20 or greater. If the amount of Si is more than 3 at % and not more than 15 at %, the semiconductor device can have a relative dielectric constant of 25 or greater.

Further, an amount of the metal species Ti contained in the first oxide layer may be in the range of 20 to 70 at %, preferably be in the range of 40 to 60 at %, when a total of the metal species Ti and the first metal species M is set to 100 at %.

The second metal species, the third metal species or the metal species Ti in the first oxide layer may have such a concentration gradient that a concentration of the second metal species and the like is high on the substrate side and gets lower at a farther point from the substrate. When a second oxide layer, as will be described later, exists between the group 14 (IVA) semiconductor substrate and the first oxide layer, the second metal species, the third metal species or the metal species Ti may have the above concentration gradient. Since a steep interface does not exist as a result of continuous change in the composition of the second oxide layer and the composition of the first oxide layer as a gate insulating film, it is advantageous in manufacturing processes as will be described later.

When the second metal species and the like has the above-described concentration gradient, the second metal species contained in the first oxide layer may have the above-described quantitative relationship in the oxide layer as a whole.

The device according to the present invention may have a second oxide layer between the group 14 (IVA) semiconductor substrate and the first oxide layer. The existence of the second oxide layer can provide continuous change in the composition of the second oxide layer and the first oxide layer as a gate insulating film, and thus non-continuous interface, non-steep interface. Because of non-steep-interface, it is preferable that the device according to the present invention may not have detrimental effect on a threshold value of the transistor. The second oxide layer may exclude oxide (e.g., $SiO_2$, etc.) formed on the group 14 (IVA) semiconductor substrate, although depending on manufacturing method described later.

The second oxide, which forms the second oxide layer, may be an oxide comprising an element contained in the group 14 (IVA) semiconductor substrate and the second metal species, or an oxide comprising an element contained in the group 14 (IVA) semiconductor substrate and the third metal species, or an oxide comprising an element contained in the group 14 (IVA) semiconductor substrate and the metal species Ti. For example, if the group 14 (IVA) semiconductor substrate is a Si substrate and the second metal species of the first oxide layer is Y (yttrium), the second oxide may preferably consist of an oxide comprised of Si and Y. Furthermore, the oxide comprised of Si and Y may be expressed as "$Y_aSi_bO_c$" (in the formula, "a", "b" and "c" depend on the structure, etc., and their amount may be a non-stoichiometric amount) or "Y silicate". Further, for example, if the group 14 (IVA) semiconductor substrate is a Ge substrate and the second metal species of the first oxide layer is Y (yttrium), the second oxide consists of an oxide comprised of Ge and Y (may be expressed, for example, as "$Y_aGe_bO_c$ (each of "a", "b" and "c" has the same definition as described above)" or "Y germanate").

The device according to the present invention may have another layer above the first oxide layer so as to have desired characteristics.

If the device according to the present invention has the second oxide layer, the device may comprise a layered structure consisting of three layers sequentially in the order of the group 14 (IVA) semiconductor substrate, the second oxide layer and the first oxide layer. The semiconductor device may have another layer above the three-layered structure so as to have desired characteristics.

The above-described semiconductor device according to the present invention may be manufactured in accordance with processes as follows: In the manufacturing methods below, the second metal species M' is used and described by way of example. However, in place of the second metal species M', the third metal species M" or the metal species Ti can be used so as to manufacture the semiconductor device with the third metal species M" or Ti, just like the above.

The semiconductor device may be manufactured according to a method, comprising: a deposition layer forming step of depositing M' doped $MO_2$ (M is a first metal species selected from a group 4 (IVB)) on a group 14 (IVA) semiconductor substrate, to form a deposition layer, wherein M' being a second metal species selected from the consisting of a group 3 (IIIB) and lanthanide series; and a first oxide layer forming step of conducting heat treatment for the deposition layer, to form an $MO_2$-$M'_xO_y$ layer (x and y are integers depending on an oxidation number of M').

The method may further comprise a second oxide layer forming step prior to the deposition layer forming step. The second oxide layer forming step may comprise a step of depositing an oxide $M'_aO_b$ (a and b are integers depending on the second species M') of the second metal species M' on the group 14 (IVA) semiconductor substrate (M' is selected from the group consisting of a group 3 (IIIB) and lanthanide series), and thereafter a step of conducting heat treatment for the deposit, to form a second oxide comprised of the second metal species and an element contained in the group 14 (IVA) semiconductor substrate.

The group 14 (IVA) semiconductor substrate, the first metal species and the second metal species M' may be the same as those described above.

Conventionally known various processes may be adopted for the process in the deposition layer forming step and for the process of forming deposited oxide $M_aO_b$. Such conventionally known processes may be a sputtering process, an atomic layer deposition process (ALD process), various CVD processes and the like.

The heat treatment in the first oxide layer forming step may be conducted between 600° C. and 1000° C., preferably between 600° C. and 800° C. In particular, the heat treatment in the first oxide layer forming step may be conducted under an inert gas having an oxygen partial pressure of 1% or lower, or in a vacuum atmosphere.

The heat treatment in the second oxide layer forming step may be conducted in a vacuum atmosphere at not more than $10^{-4}$ Pa and between 600° C. and 1000° C., preferably between 600° C. and 800° C.

The semiconductor device manufactured in accordance with the method according to the present invention may further comprise another layer above the first oxide layer so as to have desired characteristics. The method according to the present invention is a method of forming the first oxide layer on the group 14 (IVA) semiconductor substrate, as described above. Any of that includes this method is within the scope of the present invention.

The present invention will be illustrated by way of following examples, but the present invention is not limited thereto.

EXAMPLE 1

Preparation of an $HfO_2$—$Y_2O_3$ Layer and Measurement of its Dielectric Constant $HfO_2$, with 0 at % of Y, 4.4 at % of Y and 17 at % of Y doped thereto, was deposited on an N-type Si substrate from which a natural oxide layer is removed, using a sputtering process. Then, the substrate was heat-treated in an atmosphere of nitrogen containing 0.1% oxygen at temperatures of 400° C., 600° C., 800° C. and 1000° C., thereby to form a sample A-1 having an $HfO_2$—$Y_2O_3$ layer (may be referred to as "YDH" in this Example) on the N-type Si substrate. Then, a gold electrode was formed on the side of the $HfO_2$—$Y_2O_3$ layer (YDH) so as to form an MIS capacitor (FIG. 1). FIG. 1 is a conceptual diagram of the MIS capacitor 1. The MIS capacitor 1 comprises a Si substrate 3, a $SiO_2$ layer 4, an $HfO_2$—$Y_2O_3$ layer 5 and a gold electrode 6.

The electric capacity and its film thickness of the sample A-1 were measured, so as to obtain a change in the dielectric constant of the $HfO_2$—$Y_2O_3$ layer. The results are shown in FIGS. 2 and 3. In FIG. 2, the term "CET" represents an equivalent effective $SiO_2$ thickness which is obtained based on $C_{YDH}$, the electric capacity per unit area of the YDH. The dielectric constant of the YDH has been obtained with the following equation ($\epsilon_{SiO2}$: dielectric constant of $SiO_2$, $d_{YDH}$: measured thickness of $HfO_2$—$Y_2O_3$ layer (YDH), $\epsilon_{YDH}$: dielectric constant of $HfO_2$—$Y_2O_3$ layer (YDH) to be obtained).

$$CET = \epsilon_{SiO2}/C_{YDH} = d_{YDH}(\epsilon_{SiO2}/\epsilon_{YDH})$$ [Equation 1]

As can be seen from the comparison among 0 at %, 4.4 at % and 17 at % of FIG. 3, it shows that the dielectric constant increases by doping of Y (4.4 at % and 17 at %).

When a doping amount of Y is 17 at %, it is found that the temperature dependency is low, thus showing a high dielectric constant (approximately 22) even at 1000° C.

When a doping amount of Y is 4.4 at %, it is found that the YDH has a high dielectric constant at 400° C., 600° C. and 800° C. (approximately 25 at 400° C., approximately 27 at 600° C. and approximately 27 at 800° C.).

EXAMPLE 2

A sample A-2 was prepared in a manner similar to Example 1, except that a P-type Si substrate was used in place of the N-type Si substrate of the sample A-1 of Example 1. The same measurements were carried out for the sample A-2 as those of Example 1. Though not illustrated, as a result, the sample A-2 had the same effects as those of FIG. 3.

EXAMPLE 3

A sample A-3 was prepared in a manner similar to Example 1, except that an atomic layer deposition process (ALD process) was adopted instead of the sputtering process of Example 1. The same measurements were carried out for this sample A-3 as those of Example 1. Though not illustrated, as a result, the sample A-3 had the same relative dielectric constant (FIG. 3) as that of the sample A-1 obtained in Example 1.

EXAMPLE 4

A sample A-4 was prepared in a manner similar to Example 1, except that the Si substrate was heat-treated in an $NH_3$ atmosphere at 700° C. so as to form a substrate having a $Si_3N_4$ layer on the Si surface, instead of using the "N-type Si substrate from which a natural oxide layer is removed" of Example 1. The same measurements were carried out for the sample A-4 as those of Example 1. Though not illustrated, as a result, the sample A-4 had the same relative dielectric constant (FIG. 3) as that of the sample A1 obtained in Example 1.

EXAMPLE 5

Samples A-5 and A-6 were prepared in a manner similar to Example 1, except that nitrogen gas was introduced in a film-formation process using the sputtering process of Example 1 and that a heat treatment process afterwards was conducted at 600° C. Instead of having the above-described YDH layer, the samples A-5 and A-6 had YDHr layer and YDHr' layer, respectively. That is, the sample A-5 included 5 at % of nitrogen and the YDHr layer with about 4.4 at % of Y/(Hf+Y), while the sample A-6 included 10 at % of nitrogen and the YDHr' layer with about 4.4 at % of Y/(Hf+Y). The same measurements were carried out for the samples A-5 and A-6 as those of Example 1. As a result, the YDHr layer of the sample A-5 had a relative dielectric constant of 27, and the YDHr' layer of the sample A-6 had a relative dielectric constant of 26.

EXAMPLE 6

Layered Structure Having a Y Silicate Layer on the Si Substrate and a YDH Layer on the Y Silicate Layer, and its Electrical Characteristics After metal Y was vapor-deposited on the P-type Si substrate from which the natural oxide layer is removed, the substrate with the metal Y was heat-treated in a vacuum at not more than $10^{-6}$ Pa at 500° C. Y doped $HfO_2$ was deposited using the sputtering process such that 4.4 at % of Y/(Hf+Y) can be attained. Then, to obtain a layered structure that has a Y silicate layer on the Si substrate and an $HfO_2$—$Y_2O_3$ layer on this Y silicate layer, heat treatment was conducted in an $N_2$ atmosphere containing 0.1% of $O_2$ at 500° C. A gold electrode was formed on the $HfO_2$—$Y_2O_3$ layer (YDH) side of this structure, in a manner similar to Example 1, as shown in FIG. 1, to obtain a sample B-1. For the sample B-1, some measurements were carried out as follows: Measured were the characteristic of the gate voltage and electrical capacity (C-V characteristic of FIG. 4A) and the characteristic of the gate voltage and leakage current (J-V characteristic of FIG. 4B).

FIGS. 4A and B show that the sample of this Example permits only a low leakage current and has preferable electrical characteristics for the gate insulating film.

EXAMPLE 7

A sample B-2 was prepared in a manner similar to Example 6, except that the Si substrate was heat-treated in an $NH_3$ atmosphere at 700° C. so as to form a substrate having a $Si_3N_4$ layer on the Si surface, instead of using the "P-type Si substrate from which a natural oxide layer is removed" of Example 6.

For the samples B-1 and B-2 of Examples 6 and 7, the relationship between an effective oxide thickness (EOT) and the leakage current (FIG. 5) was obtained.

FIG. 5 shows that the samples have preferable electrical characteristics for the gate insulating film, regardless of whether the $Si_3N_4$ layer is provided on the surface of the Si substrate.

EXAMPLE 8

Preparation of a Sample Having a Y-Germanate Layer on a Ge Substrate and a YDH Layer on the Y-Germanate Layer $Y_2O_3$ was deposited on the Ge substrate having $GeO_2$ on the surface by using the sputtering process, followed by depositing Y doped $HfO_2$ by using the sputtering process such that 4.4 at % of Y/(Hf+Y) can be attained. Then, heat treatment was conducted in a nitrogen atmosphere containing 1% of oxygen at 400° C. or 600° C., to obtain a sample C-1. The sample C-1 comprising the $GeO_2$ layer on the Ge substrate, a $Y_2O_3$ layer on the $GeO_2$ layer and an $HfO_2$—$Y_2O_3$ layer on the $Y_2O_3$ layer. The thickness of the $Y_2O_3$ layer of the sample was measured both before deposition (before heat treatment) and after the heat treatment, and the thickness of an interface layer ($GeO_2$) formed at the interface between $Y_2O_3$/Ge of the sample was also measured both before and after the heat treatment. The results of the thickness were shown in FIG. 6.

FIG. 6 shows that the $GeO_2$ layer disappears by the heat treatment at 600° C., while the $Y_2O_3$ layer gets thicker. Because a reaction occurs between $GeO_2$ and $Y_2O_3$ by the heat treatment at 600° C., $GeO_2$ as the interface layer is caused to disappear, and $Y_2O_3$ turns to be Y-germanate. This results in the structure having Y-germanate on the Ge substrate and the YDH layer on the Y-germanate.

A paper similar to this Example reports a technique for forming the interface consisting of Y silicate and Si (e.g. M. Copel, Applied Physics Letters, Vol. 82, 1583-1585 (2003)). According to this technique, $Y_2O_3$ formed on the Si substrate having $SiO_2$ on its surface is heat-treated, with the result that $SiO_2$ disappears. The following describes two characteristics of this Example using the Ge substrate having the reactivity higher than that of the Si substrate. The two characteristics are: (1) the reaction progresses at a temperature (heat treatment at 600° C.) remarkably lower than the case wherein the Si substrate is used (reaction progresses between 850° C. and 940° C.); (2) heat treatment needs to be conducted in a non-oxygen atmosphere (e.g. a ultra high vacuum, etc.) on the Si substrate, while the reaction smoothly progresses even in an atmosphere containing oxygen on the Ge substrate.

EXAMPLE 9

Preparation of an $HfO_2$—$La_2O_3$ Layer or $HfO_2$—$CeO_2$ Layer and Measurements of their Dielectric Constants The surface of the Si wafer was oxidized so as to have an oxide layer of 100 nm. Then, platinum of 80 nm was deposited on the surface so as to form a substrate. La or Ce doped $HfO_2$ grew on the resulting substrate by using the sputtering process. In this case, La or Ce was doped in the range of 0 to 50 at %, as shown in FIG. 7. Then, heat treatment was conducted in the range of 400° C. to 800° C. in a nitrogen atmosphere containing 0.1% of oxygen, to form an $HfO_2$—$La_2O_3$ layer or $HfO_2$—$CeO_2$ layer. (In FIG. 7, the highest relative dielectric constants are plotted in the range of 400° C. to 800° C. in the heat treatment.) Finally, gold was deposited by vacuum evaporation on the surface of the layer so as to form an MIM capacitor (metal-insulator-metal capacitor).

The electric capacity of the MIM capacitor was measured, and relative dielectric constants of the layers were obtained based on a film thickness that had been measured separately from the electric capacity of the MIM capacitor in advance. The resulting relative dielectric constants are shown in FIG. 7. For comparison, FIG. 7 shows also a relative dielectric constant of the $HfO_2$—$Y_2O_3$ layer obtained in accordance with the same process as that of Example 1. In FIG. 7, the composition is expressed by a ratio of the atomic concentration of a doped element M (Y, La or Ce) and Hf: M/(Hf+M).

FIG. 7 shows that when 3 at % of La is doped, the relative dielectric constant of $HfO_2$ rapidly increases so as to reach 27. If a doping amount of La further increases, the relative dielectric constant gradually decreases. If the doping amount of La is increased up to 40 at %, the relative dielectric constant reaches 22, resulting in obtaining a larger relative dielectric constant than the relative dielectric constant (i.e. 18) of $HfO_2$ without any doped element.

When a small doping amount of Ce was doped, the doping effect was not clear. If the doping amount of Ce was increased up to 50 at %, the relative dielectric constant reached 26.

EXAMPLE 10

Preparation of an $HfO_2$—$La_2O_3$ Layer and Measurement of its Crystallization Temperature An $HfO_2$—$La_2O_3$ layer having a thickness of 30 nm was formed in a manner similar to Example 9, except that a silicon wafer that had been cleaned with hydrofluoric acid was used as a substrate. The crystallization temperature of this sample was examined. This sample was annealed at temperatures between 600° C. and 1000° C., and x-ray diffraction measurement was carried out. If the peak was detected, it is considered that the sample was crystallized. Then, the crystallization temperature was examined. The results are shown in FIG. 8.

FIG. 8 shows that if the doping amount of La increased, the crystallization temperature increased as well. In particularly, when 30 at % or more of La was doped, the sample was not crystallized at 800° C. In addition, when 40 at % or more of La was doped, the sample was not crystallized even at 900° C. These results show a dramatic improvement in that the crystallization temperature of $HfO_2$ (La is not doped) was not more than 600° C.

EXAMPLE 11

Preparation of an $HfO_2$—$La_2O_3$ Layer and Measurement of a Flatband Voltage

An $HfO_2$—$La_2O_3$ layer was formed on the silicon wafer substrate that had been cleaned with hydrofluoric acid, in a manner similar to Example 10. Samples of different thicknesses were formed with a doping amount of 40 at % of La in a nitrogen atmosphere containing 0.1% of oxygen at an annealing temperature of 600° C. Then, an MIS capacitor having a composition of gold/$HfO_2$—$La_2O_3$ layer/Si was formed, then the film thickness dependency of flatband voltage was obtained. The results are shown in FIG. 9. It is clear that the flatband voltage does not really change among different film thicknesses, and the fixed charge density is extremely low in the layer. As a result, it can be considered that the $HfO_2$—$La_2O_3$ film with a large doping amount of La has such an effect as to dramatically decrease the "fixed charge density" in the film.

EXAMPLE 12

Preparation of an HfO$_2$—SiO$_2$ Layer or HfO$_2$—TiO$_2$ Layer, and Measurements of their Dielectric Constants An HfO$_2$—SiO$_2$ layer or HfO$_2$—TiO$_2$ layer was formed in a manner similar to Example 9, except that Si or Ti was used as a doped element with a doping concentration in the range of 0 to 100 at %. Relative dielectric constants of the resulting film were measured. FIG. 10 shows a result of the measured relative dielectric constant of the HfO$_2$—SiO$_2$ layer, and FIG. 11 shows a result of the measured relative dielectric constant of the HfO$_2$—TiO$_2$ layer.

FIG. 10 shows that when Si was doped, the relative dielectric constant did not increase at 400° C., but it dramatically increased at 800° C. with 20 at % of Si or lower.

FIG. 11 shows that when Ti was doped, the relative dielectric constant increased as its doping amount increases.

Figure 1:
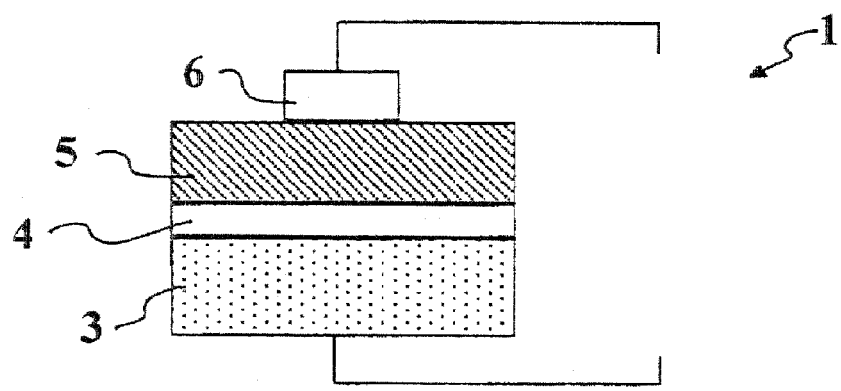
FIG. 1 is a conceptual diagram of an MIS capacitor of Example 1.
Figure 2:
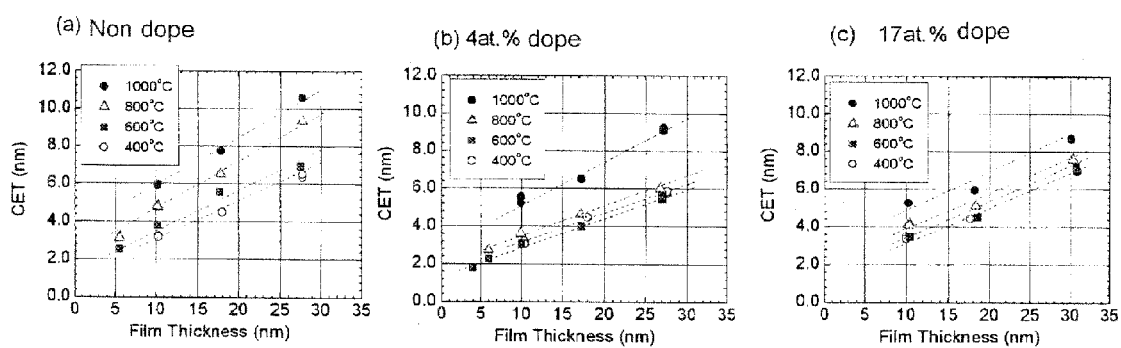
FIG. 2 shows measured results of a sample of Example 1.
Figure 3:
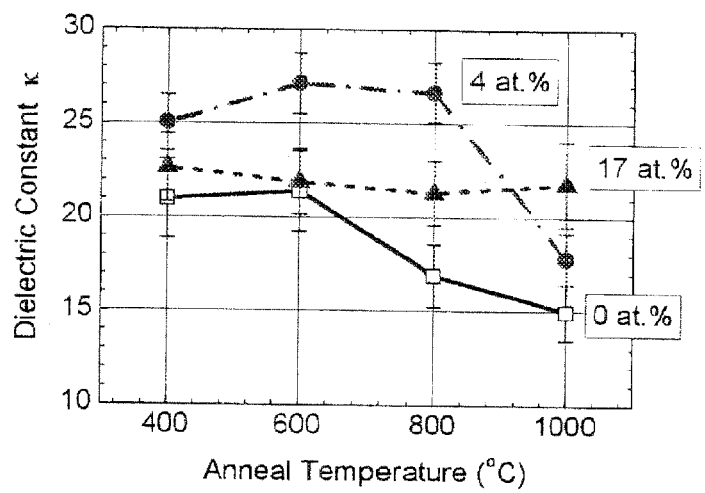
FIG. 3 shows measured results of the sample of Example 1.
Figure 4:
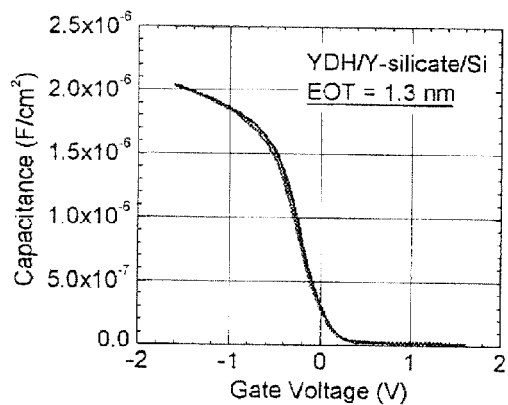
FIG. 4 shows measured results of a sample of Example 6.
Figure 4:
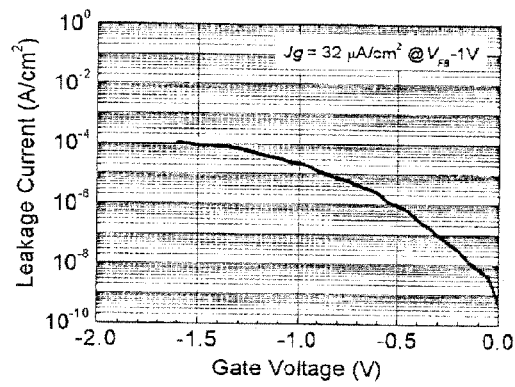
Figure 5:
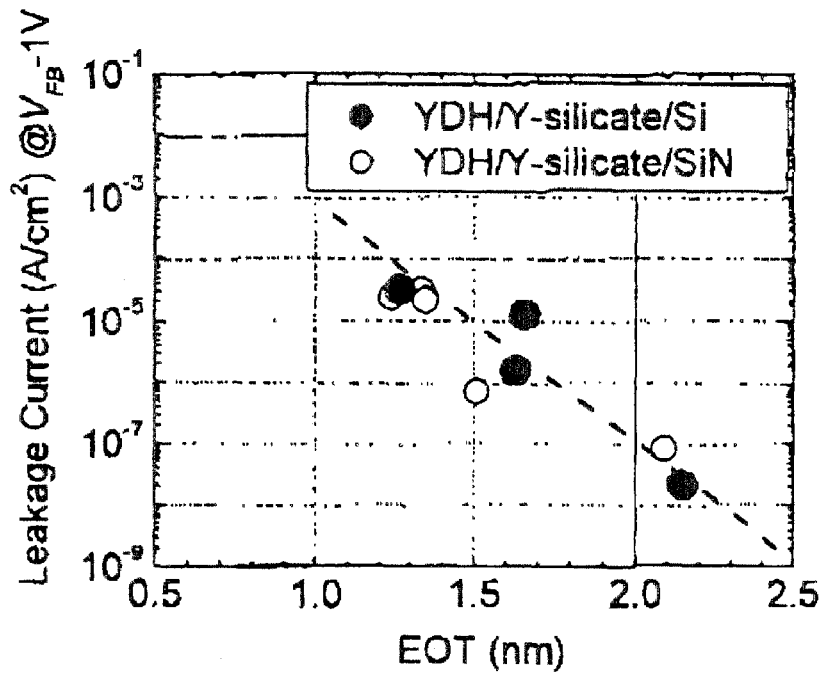
FIG. 5 shows measured results of samples of Examples 6 and 7.
Figure 6:
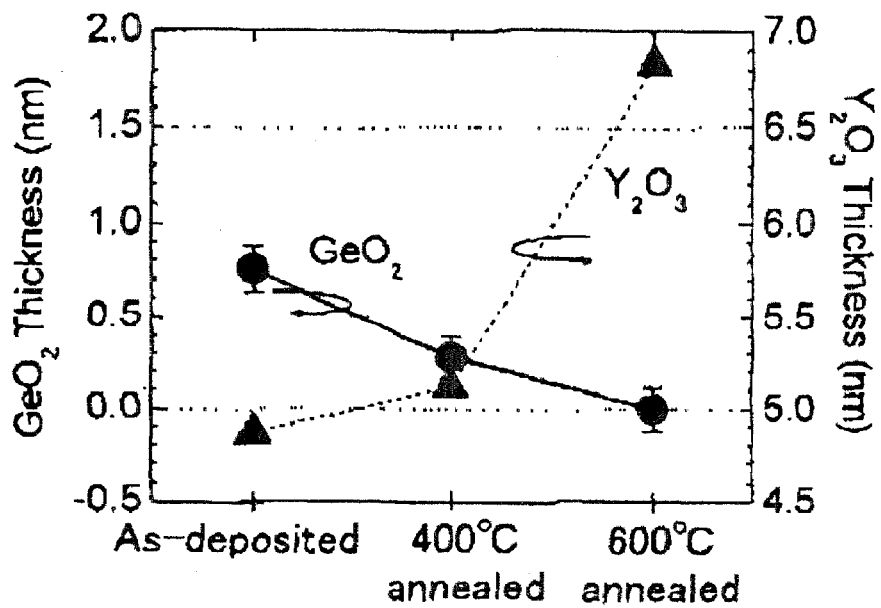
FIG. 6 shows measured results of a sample of Example 8.
Figure 7:
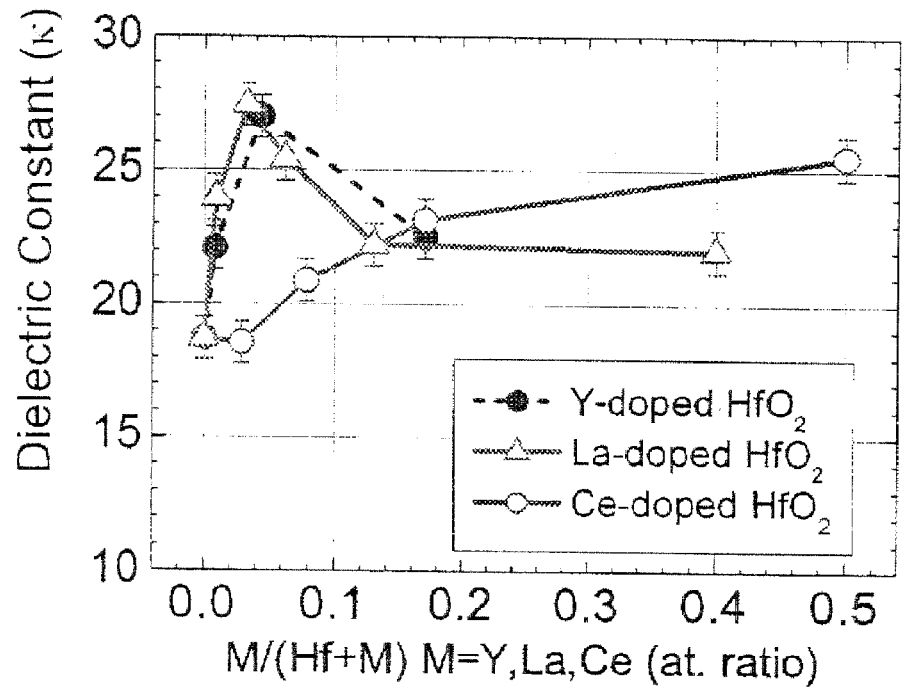
FIG. 7 shows measured results (relative dielectric constants) of a sample of Example 9.
Figure 8:
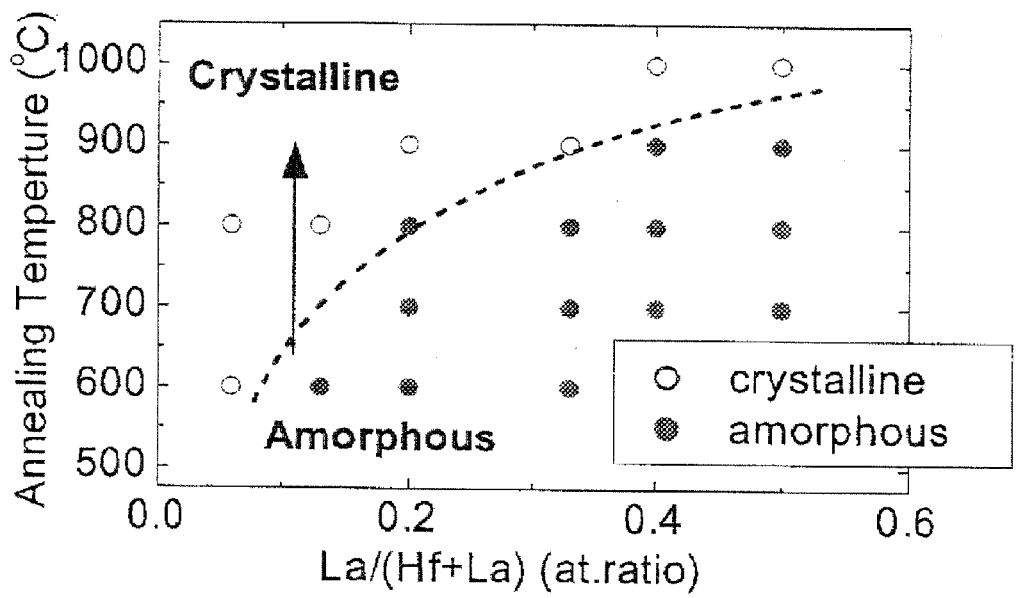
FIG. 8 shows measured results (crystallization temperature) of a sample of Example 10.
Figure 9:
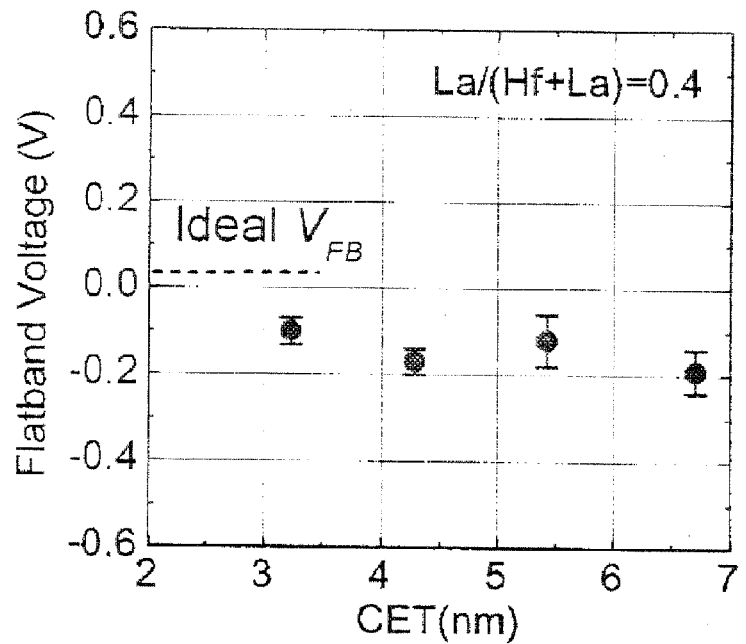
FIG. 9 shows measured results (flatband voltage) of a sample of Example 11.
Figure 10:
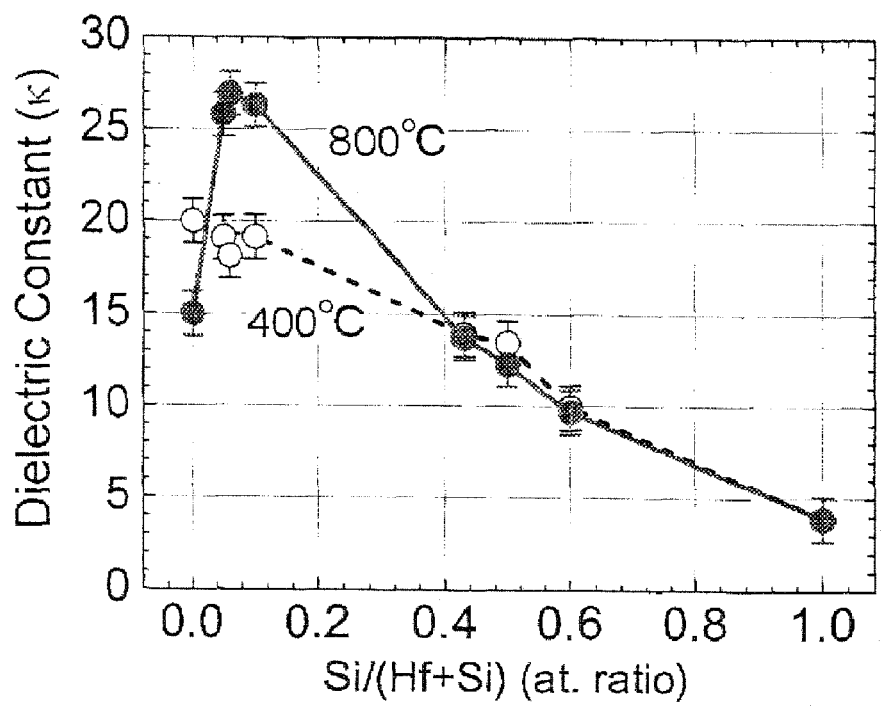
FIG. 10 shows measured results (relative dielectric constants) of a sample (HfO$_2$—SiO$_2$ layer) of Example 12.
Figure 11:
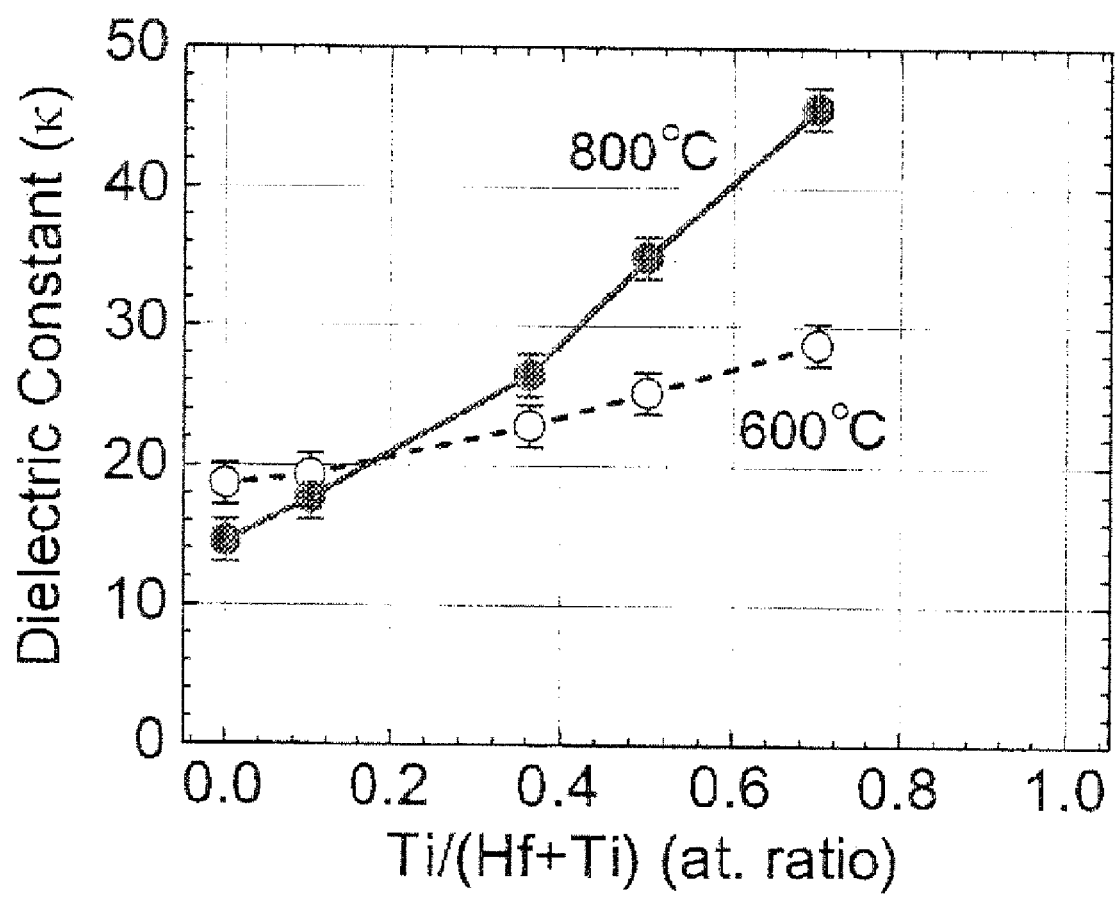
FIG. 11 shows measured results (relative dielectric constants) of a sample (HfO$_2$—TiO$_2$ layer) of Example 12.

What is claimed is:

1. A semiconductor device comprising:
   a group 14 (IVA) semiconductor substrate; and
   a first oxide layer located on said substrate, wherein the first oxide layer is comprised of MO$_2$ (M is a first metal species selected from a group 4 (IVB)) and M"O$_2$ (M" is a third metal species which is Si or Ge), and has a high dielectric constant.

2. The device according to claim 1, further comprising a second oxide layer between said group 14 (IVA) semiconductor substrate and said first oxide layer, wherein the second oxide layer comprises an oxide comprising an element contained in said group 14 (IVA) semiconductor substrate and said third metal species.

3. The device according to claim 2, comprising a layered structure consisting of three layers of said substrate, said second oxide layer and said first oxide layer.

4. The device according to claim 1,
   wherein an amount of said third metal species M" contained in said first oxide layer is more than 0 at % and not more than 50 at %, when a total of said third metal species and said first metal species is set to 100 at %.

5. The device according to claim 1,
   wherein said third metal species has such a concentration gradient in said first oxide layer that a concentration thereof is high on said substrate side and gets lower at a farther point from said substrate.

6. The device according to claim 1,
   wherein said first metal species is Hf;
   said third metal species is Si;
   said first oxide layer consists essentially of HfO$_2$—SiO$_2$, and
   an amount of Si is more than 0 at % and not more than 30 at % when a total of Si and Hf is set to 100 at %.

7. The device according to claim 1,
   wherein said first metal species is Hf;
   said third metal species is Si;
   said first oxide layer consists essentially of HfO$_2$—SiO$_2$;
   said semiconductor device has a relative dielectric constant of 25 or greater; and
   an amount of said third metal species M" contained in said first oxide layer is more than 3 at % and not more than 15 at %, when a total of said third metal species and said first metal species is set to 100 at %.

8. The device according to claim 1,
   wherein said group 14 (IVA) semiconductor substrate is a substrate selected from the group consisting of Si, Ge, SiGe, SiC, GaN and C (diamond).

9. A method of manufacturing a semiconductor device, comprising:
   a deposition layer forming step of depositing M" (M" is a third metal species which is Si or Ge) doped MO$_2$ (M is a first metal species selected from a group 4 (IVB)) on said group 14 (IVA) semiconductor substrate, to form a deposition layer; and
   a first oxide layer forming step of conducting heat treatment for said deposition layer, to form an MO$_2$-M"O$_2$ layer.

10. The method according to claim 9, further comprising a second oxide layer forming step prior to said deposition layer forming step,
    wherein the second oxide layer forming step comprises the step of depositing an oxide M"O$_2$ of said third metal species M" which is Si or Ge on said group 14 (IVA) semiconductor substrate, and thereafter conducting heat treatment for said deposit, to form a second oxide layer comprising a second oxide comprising said third metal species and an element contained in said group 14 (IVA) semiconductor substrate.

11. The method according to claim 9,
    wherein the heat treatment in said first oxide layer forming step is conducted between 600° C. and 1000° C.

12. The method according to claim 10,
    wherein the heat treatment in said second oxide layer forming step is conducted in a vacuum atmosphere at not more than 10$^{-4}$ Pa and between 600° C. and 1000° C.

13. The method according to claim 10,
    wherein said semiconductor device comprises a layered structure consisting essentially of three layers of said substrate, said second oxide layer and said first oxide layer.

14. The method according to claim 9,
    wherein said third metal species M" is doped in said deposition layer forming step in such a manner that an amount of said third metal species M" contained in said first oxide layer is more than 0 at % and not more than 50 at %, when a total of said third metal species and said first metal species is set to 100 at %.

15. The method according to claim 9,
    wherein said first oxide layer is formed in a manner that said third metal species in said first oxide layer has a concentration gradient such that a concentration of said third metal species in said first oxide layer is high on the substrate side and gets lower at a farther point from said substrate, by the heat treatment in said first oxide layer forming step.

16. The method according to claim 9, wherein said first metal species is Hf; said third metal species is Si; said first oxide layer consists essentially of $HfO_2$—$SiO_2$; and an amount of Si is more than 0 at % and not more than 30 at %, when a total of Si and Hf is set to 100 at %.

17. The method according to claim 9, wherein said first metal species is Hf; said third metal species is Si; said first oxide layer consists essentially of $HfO_2$—$SiO_2$; said semiconductor device has a relative dielectric constant of 25 or greater; and an amount of said third metal species Si contained in said first oxide layer is more than 3 at % and not more than 15 at %, when a total of Si and said first metal species is set to 100 at %.

18. The method according to claim 9, wherein said group 14 (IVA) semiconductor substrate is a substrate selected from the group consisting of Si, Ge, SiGe, SiC, GaN and C (diamond).

19. A semiconductor device comprising:
a group 14 (IVA) semiconductor substrate; and
a first oxide layer located on said substrate,
wherein the first oxide layer is comprised of $MO_2$ (M is a first metal species selected from a group 4 (IVB)) and $TiO_2$, and has a high dielectric constant.

20. The device according to claim 19, further comprising a second oxide layer between said group 14 (IVA) semiconductor substrate and said first oxide layer, wherein the second oxide layer comprises an oxide comprising an element contained in said group 14 (IVA) semiconductor substrate and a metal species Ti.

21. The device according to claim 20, comprising a layered structure consisting essentially of three layers of said substrate, said second oxide layer and said first oxide layer.

22. The device according to claim 19, wherein an amount of said metal species Ti contained in said first oxide layer is between 20 to 70 at %, when a total of said metal species Ti and said first metal species is set to 100 at %.

23. The device according to claim 19, wherein said first metal species is Hf; said first oxide layer consists essentially of $HfO_2$—$TiO_2$; said semiconductor device has a relative dielectric constant of 25 or greater; and an amount of said metal species Ti contained in said first oxide layer is between 40 and 60 at %, when a total of said metal species Ti and said first metal species is set to 100 at %.

24. The device according to claim 19, wherein said metal species Ti has such a concentration gradient in said first oxide layer that a concentration thereof is high on said substrate side and gets lower at a farther point from said substrate.

25. The device according to claim 19, wherein said group 14 (IVA) semiconductor substrate is a substrate selected from the group consisting of Si, Ge, SiGe, SiC, GaN and C (diamond).

26. A method of manufacturing a semiconductor device, comprising:
a deposition layer forming step of depositing metal species Ti doped $MO_2$ (M is a first metal species selected from a group 4 (IVB)) on a group 14 (IVA) semiconductor substrate, to form a deposition layer; and
a first oxide layer forming step of conducting heat treatment for said deposition layer, to form an $MO_2$—$TiO_2$ layer.

27. The method according to claim 26, further comprising a second oxide layer forming step prior to said deposition layer forming step, wherein the second oxide layer forming step comprises a step of depositing $TiO_2$, an oxide of a metal species Ti, on a group 14 (IVA) semiconductor substrate, and thereafter a step of conducting heat treatment for the deposit, to form a second oxide layer comprising a second oxide comprising said metal species Ti and an element contained in said group 14 (IVA) semiconductor substrate.

28. The method according to claim 26, wherein the heat treatment in said first oxide layer forming step is conducted between 600° C. and 1000° C.

29. The method according to claim 27, wherein the heat treatment in said second oxide layer forming step is conducted in a vacuum atmosphere at not more than $10^{-4}$ Pa and between 600° C. and 1000° C.

30. The method according to claim 27, wherein said semiconductor device comprises a layered structure consisting essentially of three layers of said substrate, said second oxide layer and said first oxide layer.

31. The method according to claim 26, wherein said metal species Ti is doped in said deposition layer forming step in such a manner that an amount of said metal species Ti contained in said first oxide layer is between 20 and 70 at %, when a total of said metal species Ti and said first metal species is set to 100 at %.

32. The method according to claim 26, wherein said first oxide layer may be formed in a manner that said metal species Ti in said first oxide layer has a concentration gradient such that a concentration of Ti in said first oxide layer is high on the substrate side and gets lower at a farther point from said substrate, by the heat treatment in said first oxide layer forming step.

33. The method according to claim 26, wherein said group 14 (IVA) semiconductor substrate is a substrate selected from the group consisting of Si, Ge, SiGe, SiC, GaN and C (diamond).

* * * * *